United States Patent [19]

Giguere et al.

[11] 3,971,127

[45] July 27, 1976

[54] METHOD OF FABRICATING A PRINTED WIRING BOARD ASSEMBLY

[75] Inventors: Winfield Joseph Giguere, Lincroft; David Richard Padnes, Matawan, both of N.J.

[73] Assignee: Bell Telephone Laboratories, Incorporated, Murray Hill, N.J.

[22] Filed: Sept. 10, 1975

[21] Appl. No.: 611,911

[52] U.S. Cl. .................................. 29/626; 29/628; 174/68.5; 317/101 F
[51] Int. Cl.² ......................................... H05K 3/30
[58] Field of Search ............ 29/626, 627, 628, 625, 29/604; 339/17 B, 17 C, 17 CF, 17 D, 17 F, 17 LC, 17 LM, 17 M; 174/52 R, 52 S, 52 FP, 68.5, 117 F, 117 FF, 117 PC; 317/101 A, 101 B, 101 C, 101 D, 101 F, 101 CP

[56] References Cited
UNITED STATES PATENTS

| | | |
|---|---|---|
| 3,499,220 | 3/1970 | Hintz et al. ............................ 29/626 |
| 3,501,830 | 3/1970 | Bryzinski et al. ...................... 29/604 |
| 3,718,876 | 2/1973 | Fletcher .......................... 317/101 CP |
| 3,766,439 | 10/1973 | Isaacson ........................ 317/101 F X |
| 3,818,279 | 6/1974 | Seeger et al. ...................... 29/626 X |
| 3,819,989 | 6/1974 | Braune ............................. 317/101 F |
| 3,873,889 | 3/1975 | Leyba ........................... 317/101 F X |

Primary Examiner—C.W. Lanham
Assistant Examiner—James R. Duzan
Attorney, Agent, or Firm—A. A. Tirva

[57] ABSTRACT

A method of fabricating a folded printed wiring board assembly includes the steps of cutting an aperture into a rigid board; bonding a flexible circuit tape to one side of the board so that the tape bridges the aperture; perforating a plurality of holes through the board and flexible tape; inserting leads of electrical components through the holes; conductively bonding the leads to conductors on the flexible circuit tape; cutting two edges of the board through the aperture; and folding the assembly in the area of the aperture.

6 Claims, 3 Drawing Figures

METHOD OF FABRICATING A PRINTED WIRING BOARD ASSEMBLY

BACKGROUND OF THE INVENTION

This invention relates to printed wiring boards and particularly to a method of fabricating such boards.

Folded printed wiring boards have long been known in the art and have provided a highly advantageous means for minimizing space requirements in electronic packages employing printed wiring board circuits. Prior folded printed wiring board assemblies have been built with multiple rigid board sections bonded to flexible tape circuitry. Manufacturing such assemblies is expensive because the assemblies require special fixtures to support them and to provide the necessary degree of rigidity for the assemblies through the various manufacturing and assembly operations.

Therefore, it is an object to manufacture folded printed wiring board assemblies without special fixtures.

Another object is to make folded printed wiring board assembly inexpensively.

These and other objects are realized in an illustrative embodiment of the invention in which a method for fabricating a folded printed wiring board assembly has the following steps. First, an aperture is cut into a rigid board. Second, a flexible circuit tape is bonded to one side of the board so that the tape bridges the aperture. Third, a plurality of holes are perforated through the board and the flexible tape. Fourth, leads of electrical components are inserted through the holes. Fifth, the leads are conductively bonded to conductors on the flexible circuit tape. Sixth, two edges of the board are cut through the aperture; and seventh, the assembly is folded in the area of the aperture.

A feature of the invention is the cutting of two edges of the board through the aperture.

Another feature of the invention is folding of the board in the area of the aperture.

DETAILED DESCRIPTION

Figure 1:
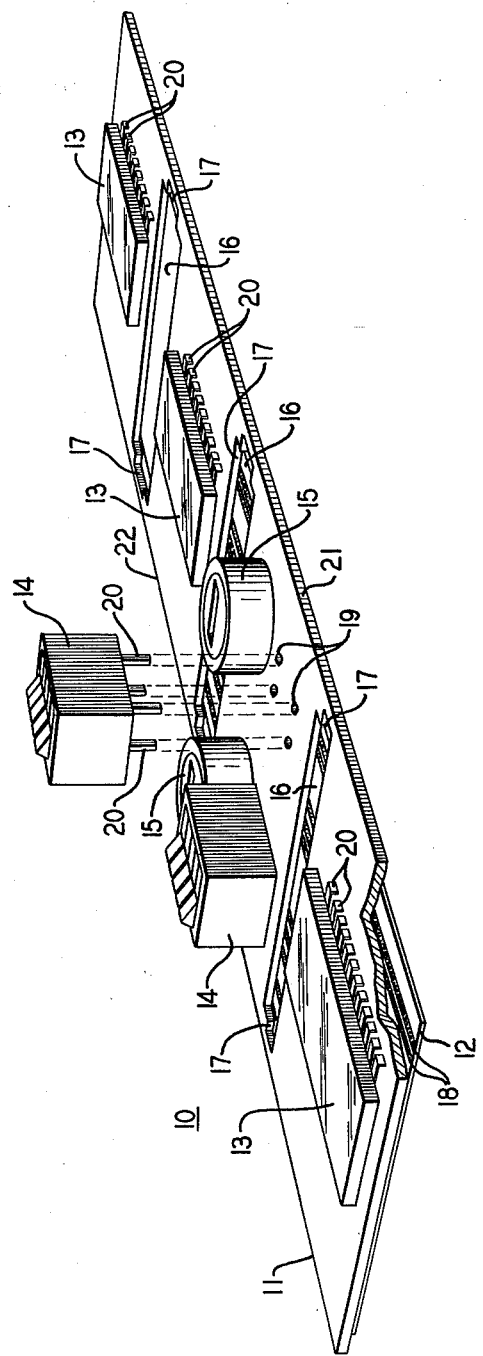
FIG. 1 is a partially exploded perspective view of a printed wiring board assembly before the edge cutting operation.

Referring now to FIG. 1, there is shown a printed wiring board assembly 10 which can be fabricated without special fixtures. The printed wiring board assembly 10 comprises a rigid board 11 having a plurality of apertures 16, a flexible circuit tape 12 bonded to the board, the tape having a plurality of predetermined lengths of metallic conductors 18 on its top and bottom sides, and a plurality of discrete electronic components 13-15 secured to the board. Conductors 18 located on opposite sides of the tape 12 are electrically interconnected by plated through holes, conductive stakes or other methods known in the art. The board 11 is made of an insulating material such as glass epoxy, a material which is generally used in printed wiring board construction. The flexible circuit tape is made of an insulating material such as epoxy impregnated dacron, a material which can be easily flexed and folded.

The assembly is fabricated as follows. First, before any other elements are attached, one or more apertures 16 are cut into the rigid board 11. The apertures 16 are located in areas of the board where the assembly eventually will be folded. The board 11 should be sufficiently thick to retain its rigidity after the cutting out of the apertures, as well as, be rigid enough for maintaining flatness during manufacturing operations while supporting the discrete electronic components 13-15. The apertures 16 are made by punching, milling or any other suitable machining process.

After the cutting out of the apertures 16, the flexible circuit tape 12 is bonded to one side of the board 11. The tape is narrower than any of the apertures 16 and is positioned so that it covers the center portion of each aperture 16, leaving an opening 17 on each side of the tape. The bonding is preferably done with a film type adhesive or some other commercially available bonding compound having properties which enable it to hold the flexible circuit tape 12 to the rigid board 11 with minimum of voids. The presence of voids can entrap moisture, and should a void bridge two electrical connectors, the moisture inside the void may cause a short circuit.

After bonding, a plurality of holes 19 required for the mounting of components 13-15 is perforated through the rigid board 11 and the attached flexible circuit tape 12 in predetermined locations. For the sake of clarity only four holes 19 required for the mounting of one of the electrical components 14 are shown in FIG. 1. The holes 19 are made by punching, drilling or any other suitable machining process.

After holes 19 have been perforated, leads 20 of electrical components 13-15 are inserted through them. Component lead insertion may be done manually, but preferably the components 13-15 are inserted by a machine, the board 11 having sufficient rigidity for easy insertion without a special fixture.

After component insertion, component leads 20 are conductively bonded to predetermined conductors 18 located on the flexible circuit tape 12. Conductive bonding may be done by wave soldering, which is done by passing the side of the board 11 having the flexible tape 12 bonded to it through a molten solder bath, the board 11 maintaining sufficient flatness to solder without a special fixture to hold the board.

Rigidity of board 11 makes performance of the above discussed bonding, perforation, insertion and conductive bonding steps possible without reliance upon fixtures to provide board 11 with the necessary degree of rigidity. If electrical tests are required, they may also be done at this stage of the fabrication process while the board is still rigid.

After the conductive bonding of component leads to flexible circuit tape and electrical testing, two oppositely located edges 21 and 22 of the rigid board 11 are cut through the aperture. The cutting operation may take the form of shearing, wherein the shear lines are made to run substantially parallel to the edges being trimmed and through the punched out apertures or cutting from each edge into the aperture.

Figure 2:
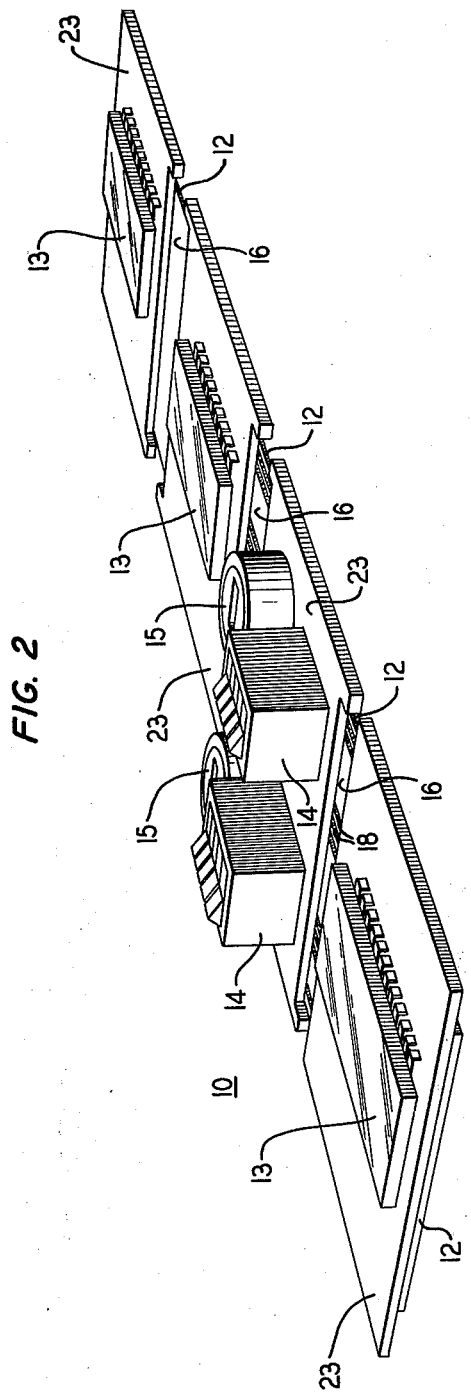
FIG. 2 is a perspective view of the board assembly shown in FIG. 1 after the edge cutting operation.

Referring now to FIG. 2, which shows the printed wiring board assembly 10 after the edge cutting operation, the assembly 10 comprises a plurality of rigid boards 23 which are joined by flexible circuit tape 12 in the areas of punched out aperture 16.

The assembly operation is completed by folding the assembly 10 in the areas of the punched out apertures 16.

Figure 3:
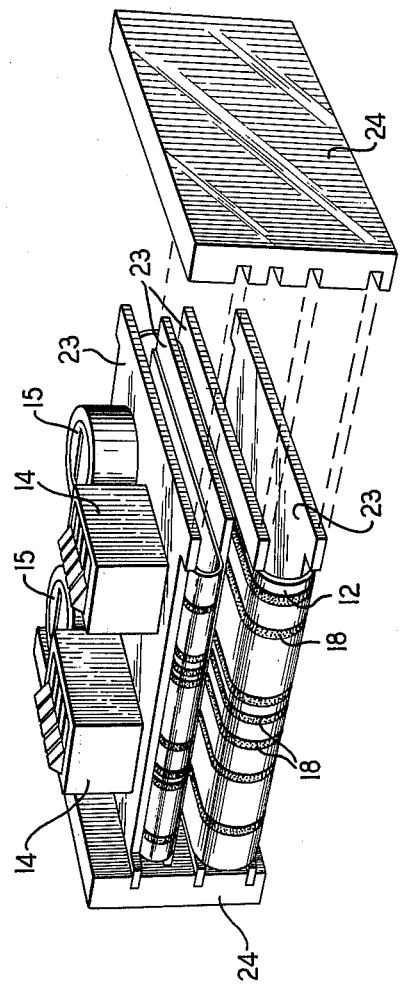
FIG. 3 is a perspective view of the board assembly shown in FIG. 2 after the folding operation.

Referring now to FIG. 3, there is shown the printed wiring board assembly 10 after the folding operation. The assembly is folded in accordian manner in areas joined by the flexible tape in such a way that the metallic conductors 18 on the flexible circuit tape 12 are on the outside of each bend and thus are substantially in tension and not compression. Compression stresses have a tendency to delaminate the conductors from the flexible tape. Finally, plastic spacers 24 are used to keep the folds of the assembly apart. The assembly as shown in FIG. 3 may be placed in a plastic can or, if electronic interference is a problem, in a metallic can (not shown).

It is to be understood that the above-described arrangement is illustrative of the application of the principles of the invention. As various changes could be made in the above-disclosed method without departing from the scope of the invention, it is intended that all matter contained in the above description, or shown in the accompanying drawings, shall be interpreted as illustrative and not in a limiting sense.

We claim:

1. A method for fabricating a folded printed wiring board assembly comprising the following steps in the order named:

cutting at least one aperture into a rigid board, bonding a flexible circuit tape to one side of the board so that the tape bridges the aperture, perforating a plurality of holes through the board and the flexible tape, inserting leads of electrical components through the holes, conductively bonding the compound leads to conductors on the flexible circuit tape, cutting two edges of the board through the aperture, and folding the assembly in the area of the aperture.

2. The method as recited in claim 1 wherein the step of bonding the tape includes positioning of the tape so that the tape covers only the center portion of the aperture leaving an opening on each side of the tape.

3. The method as recited in claim 1 wherein the step of conductively bonding the component leads includes passing the side of the board having the flexible tape bonded to it through a molten solder bath.

4. The method as recited in claim 1 wherein the step of cutting two edges of the board includes shearing the two edges so that the shear lines run through the aperture.

5. The method as recited in claim 1 wherein the step of cutting two edges of the board includes cutting from each edge into the aperture.

6. The method as recited in claim 1 wherein the step of folding the board includes folding it so that the metallic conductors located on the flexible tape in the areas where the tape is folded are on the outside of each bend.

* * * * *

UNITED STATES PATENT AND TRADEMARK OFFICE
CERTIFICATE OF CORRECTION

PATENT NO. : 3,971,127
DATED : July 27, 1976
INVENTOR(S) : Winfield J. Giguere and David R. Padnes It is certified that error appears in the above-identified patent and that said Letters Patent are hereby corrected as shown below:

```
Column 2, line 42, "locatcd" should read --located--.
Column 4, line  5, "compound" should read --component--.
```

Signed and Sealed this

Twenty-sixth Day of October 1976

[SEAL]

Attest:

RUTH C. MASON
*Attesting Officer*

C. MARSHALL DANN
*Commissioner of Patents and Trademarks*